United States Patent
Nelson

(10) Patent No.: US 7,639,952 B2
(45) Date of Patent: Dec. 29, 2009

(54) CALCULATION OF LASER SLOPE EFFICIENCY IN AN OPTICAL TRANSCEIVER MODULE

(75) Inventor: Stephen T. Nelson, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 629 days.

(21) Appl. No.: 11/386,374

(22) Filed: Mar. 22, 2006

(65) Prior Publication Data

US 2006/0216040 A1 Sep. 28, 2006

Related U.S. Application Data

(60) Provisional application No. 60/664,016, filed on Mar. 22, 2005.

(51) Int. Cl.
H04B 10/00 (2006.01)
H04B 10/08 (2006.01)
(52) U.S. Cl. ............ 398/136; 398/22; 398/137
(58) Field of Classification Search ............ 398/22, 398/135–138, 164
See application file for complete search history.

(56) References Cited

U.S. PATENT DOCUMENTS

| 6,512,617 | B1 * | 1/2003 | Tanji et al. | 398/137 |
| 2004/0136708 | A1 * | 7/2004 | Woolf et al. | 398/22 |
| 2004/0136720 | A1 * | 7/2004 | Mahowald et al. | 398/135 |
| 2006/0110157 | A1 * | 5/2006 | Tritschler et al. | 398/22 |

\* cited by examiner

*Primary Examiner*—Dalzid Singh
(74) *Attorney, Agent, or Firm*—Workman Nydegger

(57) ABSTRACT

Systems and methods are provided for determining and compensating for the laser slope efficiency of a light source positioned in an optical transmitter in order to properly set a modulation current for the light source. In one embodiment, a method for setting a modulation current for the laser of an optical transmitter is disclosed, wherein data relating to the laser transmit power and laser bias current at a plurality of laser bias current levels are sensed. A processor is then employed to calculate a slope efficiency of the laser using the data. The processor then determines a desired modulation current for the laser using the slope efficiency. Then if needed, the modulation current of the laser is modified to match the desired modulation current.

22 Claims, 5 Drawing Sheets

CALCULATION OF LASER SLOPE EFFICIENCY IN AN OPTICAL TRANSCEIVER MODULE

RELATED APPLICATIONS

This application claims the benefit of U.S. patent application Ser. No. 60/664,016, entitled "Calculation of Laser Slope Efficiency in an Optical Transceiver Module," filed on Mar. 22, 2005, which is incorporated herein by reference in its entirety.

BACKGROUND

1. Technology Field

The present invention generally relates to optical transmitters. In particular, the present invention relates to an optical device including an optical transmitter, wherein the optical device is capable of dynamically measuring and compensating for the laser slope efficiency of an optical signal produced and transmitted by the optical transmitter.

2. The Related Technology

A properly operating light source is integral to functionality of an optical transmitter. Such light sources, including for example a laser diode positioned in a transmitter optical subassembly of an optical transceiver module, should conform to pre-defined parameters propounded by the manufacturer or applicable industry. These pre-defined parameters involve various characteristics of the optical signal produced by the laser, such as average light level, extinction ratio ("ER"), and optical modulation amplitude ("OMA"). These parameters, which indicate whether the optical signal is adequate for data transmission purposes are defined by the particular physical transmissive interface, i.e., Fibre Channel, gigabit ethernet, Sonet, etc.

Various factors can affect the operating parameters of a laser diode during its optical transmission activities, which can correspondingly cause the laser to exceed acceptable ranges for such parameters. One of these factors is laser temperature. As is known, the ambient temperature in the vicinity of the laser diode within an optical transmitter can fluctuate during operation, thereby affecting the above-referenced parameters. Should one or more parameters exceed predefined acceptable ranges, the optical signal produced by the laser can be adversely affected. Examples of operating parameters for a laser include its average light level, extinction ratio, and optical modulation amplitude.

Known attempts for compensating for laser characteristics dependent upon temperature have involved the use of temperature-sensitive analog components to alert for the need to adjust laser current during operation, which in turn desirably affects laser temperature. In another attempt, laser controllers have been employed that include pre-set laser current or power compensation tables based on digital measurement. In the latter case, detection of an ambient temperature fluctuation can be forwarded to the controller, which consults the pre-set compensation table and instructs the laser controls to be modified accordingly. Such controllers, while partially effective, nonetheless suffer from various disadvantages. Among the disadvantages is the fact that the compensation table used by the controller must be predefined during optical transmitter manufacture, and as such, is not capable of dynamic laser modification according to present operating requirements. Moreover, as each laser is slightly different with respect to other lasers, time must be taken during optical transmitter manufacture to calibrate the laser and the pre-set compensation tables of the controller. This can represent a significant expense in terms of manufacture time.

Another factor affecting laser operation relates to the fact that laser operating properties change over the operational lifetime of the laser. Thus, with all other conditions remaining equal, a laser may still fall outside of acceptable parameter ranges as it advances through its operational lifetime. This operational variability over the life of the laser represents another challenge for maintaining the laser within proper operational parameter ranges.

In light of the above, a need therefore exists for dynamic evaluation of one or more operating parameters of a laser disposed within an optical transmitter, such as a transmitter optical subassembly of an optical transceiver module. Specifically, a need exists for the ability to dynamically measure laser slope efficiency during transmitter operation and to modify the operational characteristics of the laser in order to maintain it within acceptable ranges for specified parameters.

BRIEF SUMMARY

Briefly summarized, embodiments of the present invention are directed to systems and methods for determining and compensating for the slope efficiency of a light source, such as a directly-modulated laser, positioned in an optical transmitter in order to properly set a modulation current for the laser. In one embodiment, a method for setting a modulation current for the laser of an optical transmitter is disclosed wherein data relating to the laser transmit power and laser bias current at a plurality of laser bias current levels are sensed. A processor is then employed to calculate a slope efficiency of the laser using the data. The processor then determines a desired modulation current for the laser using the slope efficiency. Then if needed, the modulation current of the laser is modified to match the desired modulation current.

In another embodiment an optical transmitter device is disclosed. The device includes a transmitter optical subassembly having a laser, a plurality of sensors that sense data regarding bias current, modulation current, and transmit power of the laser, and a processor. The processor contains microcode that enables the processor to determine a slope efficiency of the laser using at least some of the data acquired by the plurality of sensors and to adjust the modulation current of the laser according to the determined slope efficiency.

In yet another embodiment a method for compensating for a slope efficiency of a laser in an optical transmitter is disclosed. The method includes varying a bias current of the laser to at least two bias current levels, sensing analog data relating to a transmit power and a bias current of the laser for the at least two bias current levels, converting the analog data to digital data, calculating a slope efficiency of the laser using the digital data, determining a desired modulation current for the laser according to the slope efficiency, and if needed, setting the modulation current for the laser according to the desired modulation current. This method is periodically repeated to ensure proper laser calibration.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-6 depict various features of embodiments of the present invention, which is generally directed to controlling a light source, such as a laser, in an optical transmitter, such as an optical transceiver module, according to data relating to slope efficiency of the light source during operation. In the exemplary embodiment, the laser is included in a transmitter optical subassembly ("TOSA") of an optical transceiver module ("transceiver"). The TOSA, together with a receiver optical subassembly ("ROSA") of the transceiver, include various components to enable the reception and transmission of optical signals to and from a host system that is operably connected to the transceiver. The host system can be included as a node in an optical communications network, for instance, and can employ the transceiver in communicating via optical signals with other components of the network. Note, however, that the discussion to follow regarding embodiments of the present invention as they relate to conditioning a laser device as part of a transceiver should not be construed as a limiting of the application of such embodiments. Indeed, devices and components apart from transceivers that employ laser devices and other suitable light sources can also benefit from the teachings to be discussed herein.

1. Exemplary Operating Environment

Figure 1:
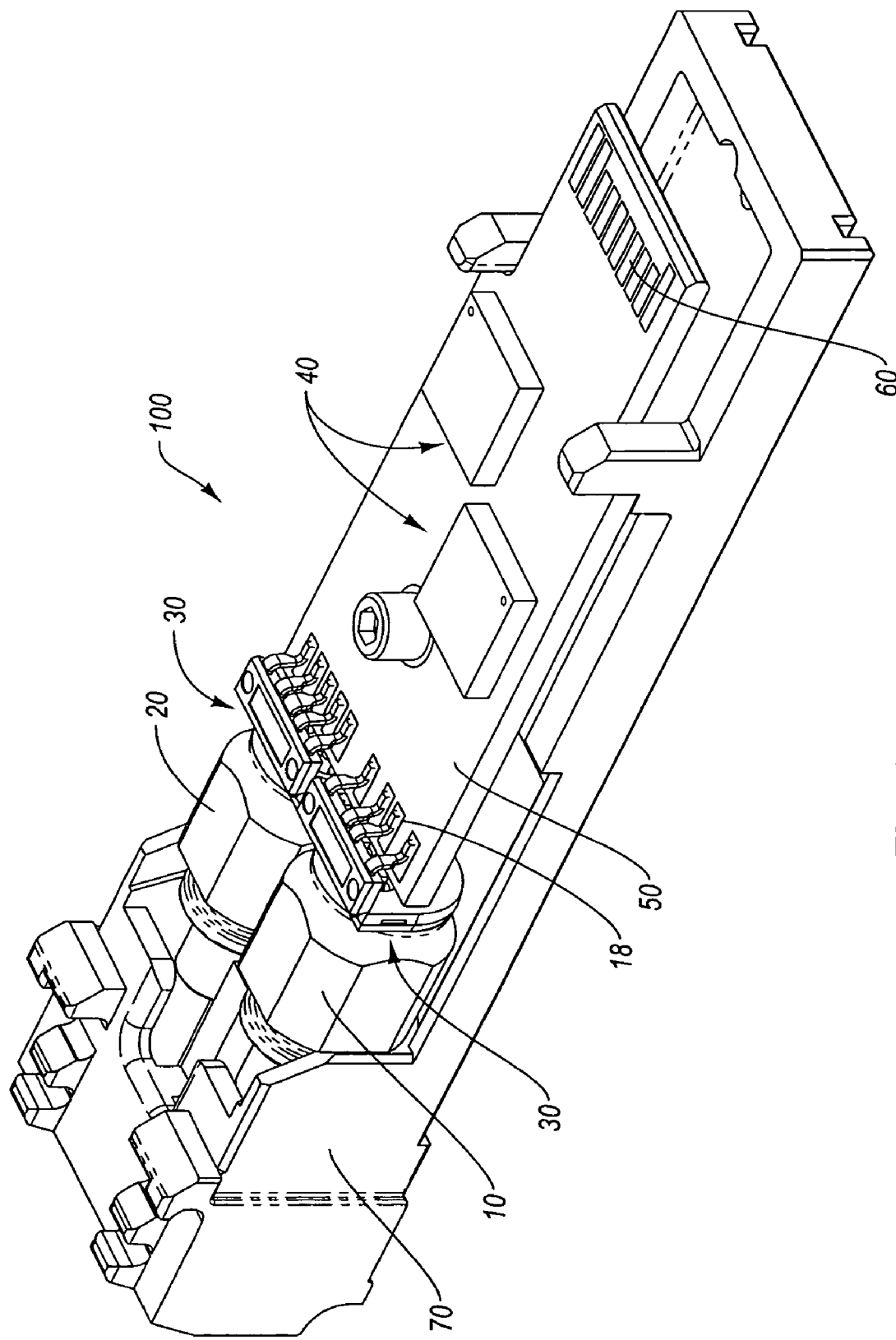
FIG. 1 is a perspective view of an optical transceiver module that is configured in accordance with embodiments of the present invention.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board 50. In detail, two electrical interfaces 30 are included in the transceiver 100, one each used to electrically connect the ROSA 10 and the TOSA 20 to a plurality of conductive pads located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a housing portion 70. Though not shown, a shell can cooperate with the housing portion 70 to define a covering for the components of the transceiver 100.

Figure 2:
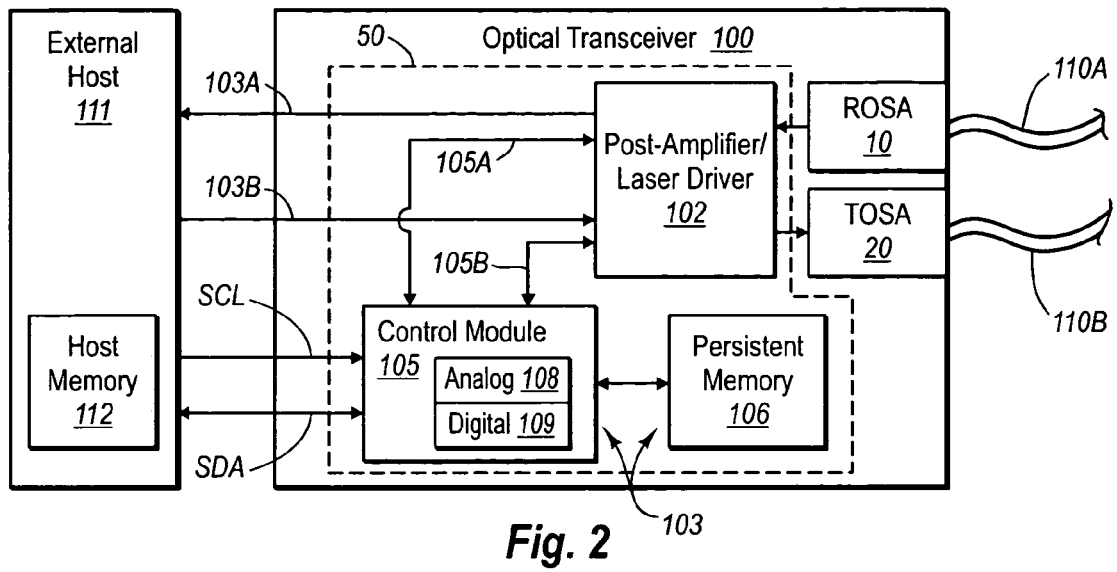
FIG. 2 is a simplified block view showing various aspects of the optical transceiver module of FIG. 1.

Reference is now made to FIG. 2, which is a simplified block diagram of the transceiver 100 of FIG. 1, depicting various physical and operational aspects thereof. While the optical transceiver 100 will be described in some detail, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 4 Gbit, 8 Gbit, 10 Gbit, or higher bandwidth fiber optic links. Furthermore, the principles of the present invention can be implemented in optical transceivers of any form factor such as XFP, SFP and SFF, without restriction.

In operation, the optical transceiver 100 receives an optical signal from a fiber 110A via the ROSA 10 in manner to be described more fully below. The ROSA 10 acts as an opto-electric transducer by transforming the received optical signal into an electrical signal. The ROSA 10 provides the resulting electrical signal to a post-amplifier. In the illustrated embodiment, the post amplifier is consolidated with a laser driver as an integrated post amplifier/laser driver ("PA/LD") 102. As such, the PA/LD 102 resides on a single integrated circuit chip and is included as a component, together with the other electronic components 40, some of which are further described below, on the printed circuit board ("PCB") 50. Further details regarding the integrated PA/LD 102 can be found in U.S. patent application Ser. No. 10/970,529, entitled "Integrated Post Amplifier, Laser Driver, and Controller," filed Oct. 21, 2004 (the "'529 application"), which is incorporated herein by reference in its entirety. In other embodiments, the post amplifier and laser driver can be included as separate components on the PCB 50.

The post-amplifier portion of the PA/LD 102 amplifies the electrical signal and provides the amplified signal to an external the host 111 as represented by arrow 102A. The external host 111 may be any computing system capable of communicating with the optical transceiver 100. The external host 111 may contain a host memory 112 that may be a volatile or non-volatile memory source.

The optical transceiver 100 may also receive electrical signals from the host 111 for transmission onto a fiber 110B. Specifically, the laser driver portion of the PA/LD 102 receives the electrical signal as represented by the arrow 102B, and drives a laser within the TOSA 20 with signals that cause the TOSA to emit onto the fiber 110B optical signals representative of the information in the electrical signal provided by the host 111. Accordingly, the TOSA 20, which corresponds to the TOSA shown in FIG. 1B, serves as an electro-optic transducer.

The behavior of the ROSA 10, the PA/LD 102, and the TOSA 20 may vary dynamically due to a number of factors. For example, temperature changes, power fluctuations, and feedback conditions may each affect the performance of these components. Accordingly, the transceiver 100 includes a control module 105, which may evaluate environmental conditions, such as temperature, and/or operating conditions, such as voltage, and receive information from the post-amplifier portion of the PA/LD 102 (as represented by arrow 105A) and from the laser driver portion of the PA/LD (as represented by arrow 105B). This allows the control module 105 to optimize the dynamically varying performance, and additionally detect when there is a loss of signal, as will be described in greater detail below. The control module 105, the post-amplifier 102, and the laser driver 103 may be the same chip, as disclosed in the '529 application. Alternatively, they may be distributed across two or more chips on the PCB 50.

Specifically, the control module 105 may optimize the operation of the transceiver 100 by adjusting settings on the PA/LD 102 as represented by the arrows 105A and 105B. These settings adjustments can be intermittent and made when temperature or voltage or other low frequency changes so warrant, or can be periodically performed in accordance with a scheduled pattern.

The control module 105 may have access to a persistent memory 106, which in one embodiment, is an electrically erasable and programmable read only memory ("EEPROM"). Persistent memory 106 may also be any other non-volatile memory source.

The persistent memory 106 and the control module 105 may be packaged together in the same package or in different packages without restriction. Data and clock signals may be provided from the host 111 to the control module 105 using the serial clock line SCL, and the serial data line SDA. Also data may be provided from the control module 105 to the host 111 using serial data signal SDA to allow for transmitting diagnostic data such as environmental and/or operational parameters. The control module 105 includes both an analog portion 108 and a digital portion 109. Together, they allow the control module to implement logic digitally, while still largely interfacing with the rest of the optical transceiver 100 using analog signals.

As used herein, the term "diagnostic data" will refer to both environmental parameters and operational parameters, whether the parameter is provided as raw data or processed data. Diagnostic data can be provided in analog or digital form. The environmental parameter may be, for example, supply voltage, humidity, acceleration, ambient light levels, ambient vibration, magnetic flux intensity, ambient interior transceiver temperature, or any other environmental parameter that may affect the performance of an optoelectronic device and that may be compensated for by suitable adjustment of one or more operational parameters. Environmental parameters may also be independent of the operation of the optoelectronic device, but may, nevertheless, affect operational parameters. Operational parameters can include statistical information such as, for example, a total a operational time, an average operational time between boots, a total number of error conditions encountered, an identification of one or more error conditions encountered, a categorization of the number of error conditions encountered for a plurality of different error types, a number of times the optical transceiver has been booted, or the like. Operational parameters also include, for example, a laser wavelength approximation, a laser temperature measurement, a transceiver temperature measurement, a laser bias current measurement, a Thermo Electric Cooler (TEC) current measurement, a transmit power measurement, a receive power measurement, or the like.

Figure 3:
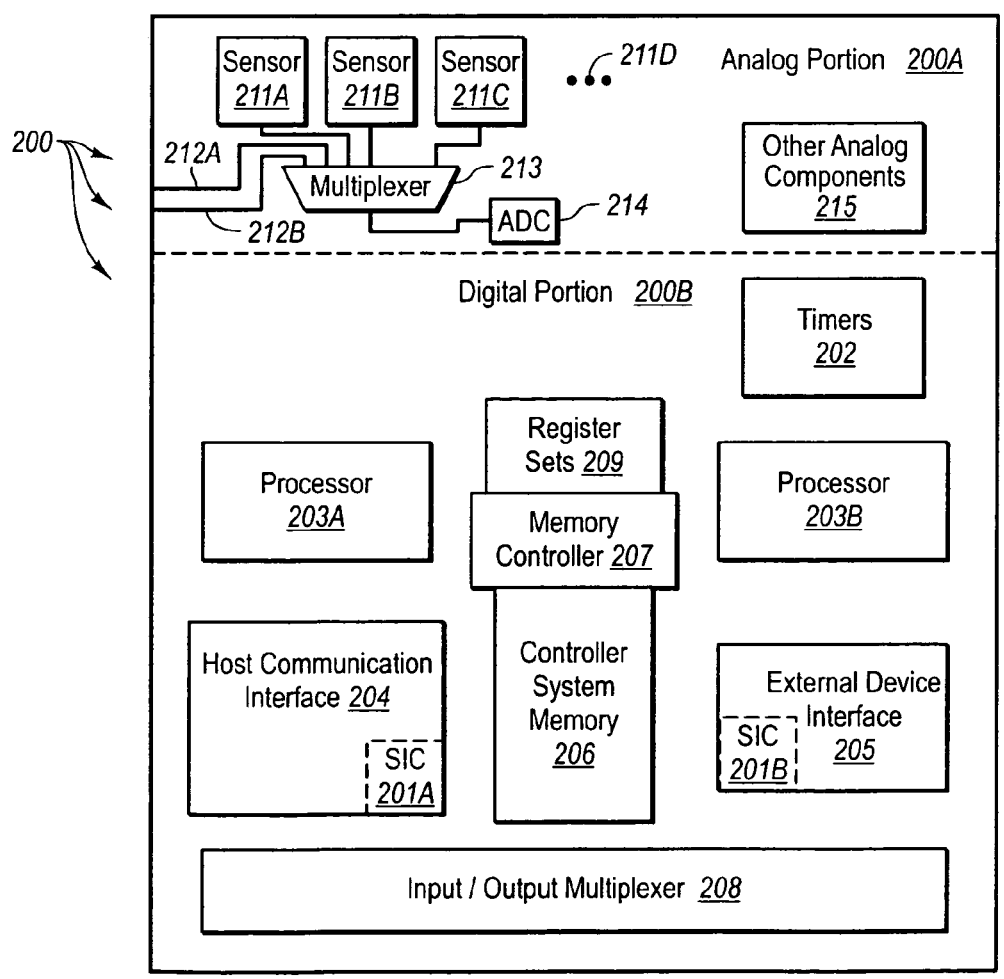
FIG. 3 is a simplified block view of an integrated circuit control module included in the optical transceiver module shown in FIG. 2.

FIG. 3 schematically illustrates an exemplary configuration 200 of the control module 105 in further detail. The control module 200 includes an analog portion 200A that represents an example of the analog portion 108 of FIG. 2, and a digital portion 200B that represents an example of the digital portion 109 of FIG. 2. For example, the analog portion 200A may contain digital to analog converters, and analog to digital converters, high speed comparators (e.g., for event detection), voltage-based reset generators, voltage regulators, voltage references, clock generator, and other analog components. For example, the analog portion includes sensors 211A, 211B, 211C amongst potentially others as represented by the horizontal ellipses 211D. Each of these sensors may be responsible for measuring environmental and/or operational parameters that may be measured from the control module 200 such as, for example, supply voltage and transceiver temperature. The control module may also receive external analog or digital signals from other components within the optical transceiver. Two external lines 212A and 212B are illustrated for receiving such external analog signals although there may be many of such lines.

The internal sensors 211A through 211D may generate analog signals that represent the measured values. In addition, the externally provided signals 212A, 212B may also be analog signals. In this case, the analog signals are converted to digital signals so as to be available to the digital portion 200B of the control module 200 for further processing. Of course, each analog parameter value may have its own Analog to Digital Converter (ADC). However, to preserve chip space, each signal may be periodically sampled in a round robin fashion using a single ADC such as the illustrated ADC 214. In this case, each analog value may be provided to a multiplexer 213, which selects in a round robin fashion, one of the analog signals at a time for sampling by the ADC 214. Alternatively, multiplexer 213 may be programmed to allow for any order of analog signals to be sampled by ADC 214.

As previously mentioned, the analog portion 200A of the control module 200 may also include other analog components 215 such as, for example, digital to analog converters, other analog to digital converters, high speed comparators (e.g., for event detection), voltage-based reset generators, voltage regulators, voltage references, clock generators, and other analog components.

The digital portion 200B of the control module 200 may include a timer module 202 that provides various timing signals used by the digital portion 200B. Such timing signals may include, for example, programmable processor times. The timer module 202 may also act as a watchdog timer.

Two general-purpose processors 203A and 203B are also included. The processors recognize instructions that follow a particular instruction set, and may perform normal general-purpose operation such as shifting, branching, adding, subtracting, multiplying, dividing, Boolean operations, comparison operations, and the like. In one embodiment, the general-purpose processors 203A and 203B are each a 16-bit processor and may be identically structured. The precise structure of the instruction set is not important to the principles of the present invention as the instruction set may be optimized around a particular hardware environment, and as the precise hardware environment is not important to the principles of the present invention. Also, though one or both processors may be used in connection in the description to follow, a dual-processor configuration is not required to practice embodiments of the present invention.

A host communications interface 204 is used to communicate with the host 111 using the serial data ("SDA") and serial clock ("SCL") lines of the optical transceiver 100. The external device interface 205 is used to communicate with, for example, other modules within the optical transceiver 100 such as, for example, the post-amplifier 102, the laser driver 103, or the persistent memory 106.

The internal controller system memory 206 (not to be confused with the external persistent memory 106) may be Random Access Memory (RAM) or non-volatile memory. The memory controller 207 shares access to the controller system memory 206 amongst each of the processors 203A and 203B and with the host communication interface 204 and the external device interface 205.

In one embodiment, the host communication interface 204 includes a serial interface controller 201A, and the external device interface 205 includes a serial interface controller 201B. The two serial interface controllers 201A and 201B may communicate using a two-wire or other suitable serial interface so long as the interface is recognized by both communicating modules. One serial interface controller (e.g., serial interface controller 201B) is a master component, while the other serial interface device (e.g., serial interface device 201A) is a slave component.

An input/output multiplexer 208 multiplexes the various input/output pins of the control module 200 to the various components within the control module 200. This enables different components to dynamically assign pins in accordance with the then-existing operational circumstances of the control module 200. Accordingly, there may be more input\output nodes within the control module 200 than there are pins available on the control module 200, thereby reducing the footprint of the control module 200.

Having described a specific environment with respect to FIGS. 1-3, it will be understood that this specific environment is only one of countless architectures in which the principles of the present invention may be employed. As previously stated, the principles of the present invention are not intended to be limited to any particular environment.

Referring to FIGS. 2 and 3, control module 105 executes microcode received from a source. Specifically, processors 203A and 203B load microcode from the source into the controller system memory 206. While system memory may be RAM, it may also be a register, flip-flop or other memory device. For example, the processors 203 may load microcode stored in persistent memory 106 into controller system memory 206. The microcode from persistent memory 106 may include functions that direct which operational parameters to measure.

2. Compensation for Laser Slope Efficiency

Figure 4:
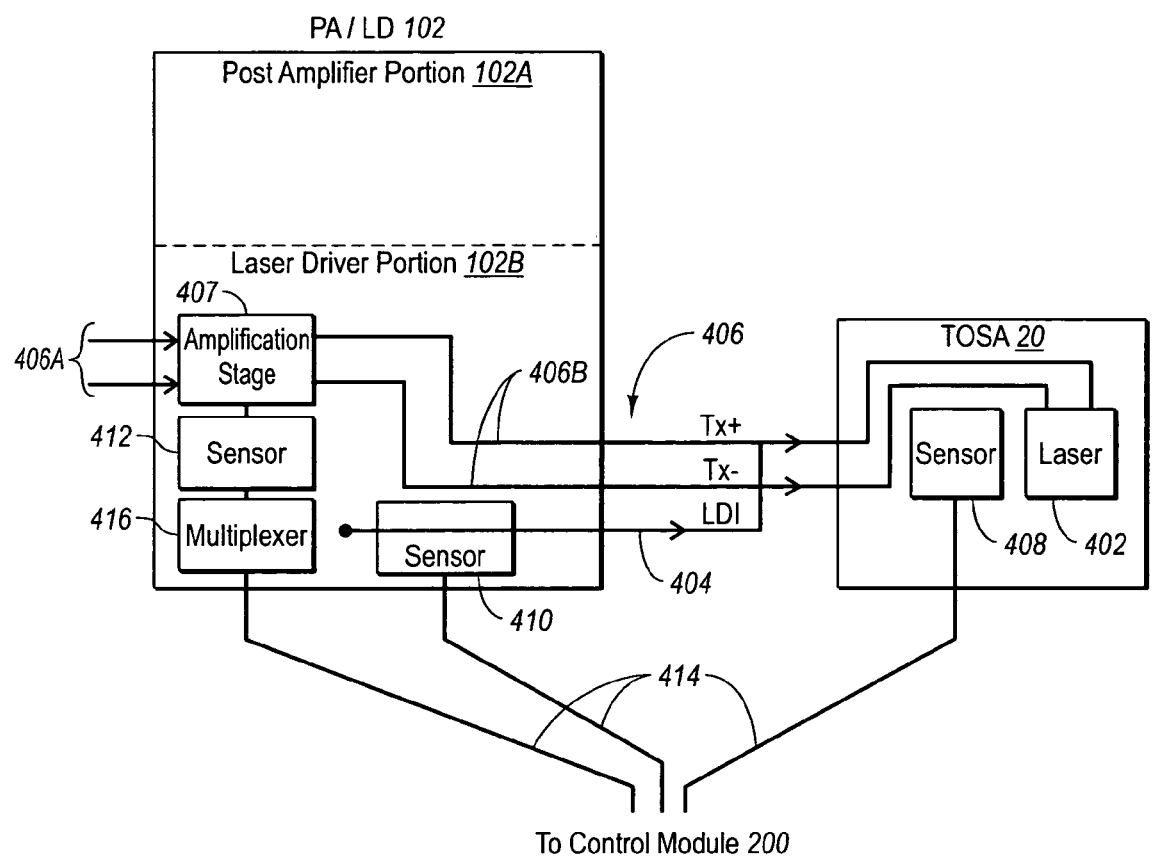
FIG. 4 is a simplified block view of the post amplifier/laser driver and TOSA shown in FIG. 2, illustrating further details thereof.

Together with FIGS. 1-3, reference is now made to FIG. 4. In general, the operating environment described above, including the transceiver 100, is exemplary of one environment in which principles of the present invention can be practiced. In particular, embodiments of the present invention enable dynamic measurement of and compensation for the laser slope efficiency of a laser diode or other suitable light source disposed within an optical transmitter, such as the transceiver 100 detailed above. This enables a transceiver or other suitable device in which the laser or light source is disposed to set and dynamically adjust optical transmit power and modulation current, as will be seen below. Embodiments of the present invention further are benefited by the digital control offered by a control module such as the control module 105/200 described in connection with FIGS. 2 and 3 above, as will be seen.

In particular, FIG. 4 further describes various components of the PA/LD 102 and TOSA 20 of FIG. 2, which are used in dynamically compensating for the slope efficiency of a light source according to embodiments of the present invention. As shown, the PA/LD 102 includes a post amplifier portion 102A and a laser driver portion 102B. Though shown in the illustrated embodiment to form a single component, the PA/LD 102 can be included as a discrete post amplifier and laser driver in other embodiments. The TOSA 20 includes a light source, such as a laser 402. The laser 402 can be a vertical cavity surface emitting laser ("VCSEL"), a distributed feedback ("DFB") laser, or the like. As detailed above, during transceiver operation the TOSA 20 provides an optical signal for transmission on an optical fiber, such as the fiber 110B shown in FIG. 2. The laser 402 is employed to convert an electrical data signal received from the external host 111 (FIG. 2) into an optical data signal, as already described, in order to enable the transmission of desired data via the fiber 110B.

The electrical data signal is supplied to the laser 402 via a pair of differential signal lines 406, shown in FIG. 4. Each signal line of the differential signal line pair carries one of two streams of differential electrical data that differ from each other only in signal polarity. As such, the lines are respectively indicated with a "TX+" or a "TX−" indicator, indicating the respective positive or negative polarity of each line. The differential signal line pair 406 of FIG. 4 corresponds to the line indicated at 103B in FIG. 2 extending from the external host 111 to the PA/LD 102.

In further detail, the differential signal lines 406 are subdivided in the present embodiment to include a first signal line portion 406A extending from the host 111 to an amplification stage 407 in the PA/LD 102, and a second signal line portion 406B extending from the amplification stage 407 to the laser 402 of the TOSA 20. The differential data signal carried by the second signal lines portion pair 406B is referred to herein as "modulation current." The amplification stage 407 of FIG. 4 represents one or more components that are used to condition the data signal carried by the first signal line portion pair 406A prior to conversion into an optical signal for transmission by the transceiver 100.

A laser DC current ("LDI") signal line 404 is also shown in FIG. 4 extending from the PA/LD 102 to the differential signal lines 406. The purpose of the signal line 404, then, is to provide sufficient current for the lazing function of the laser 402. The current carried by LDI signal line 404 is referred to herein as "bias" or "DC" current.

FIG. 4 further shows a plurality of sensors that are placed in relation to the PA/LD 102 and TOSA 20 in order to enable data regarding the operation of the laser 402 to be sensed, in connection with compensating for the slope efficiency of the laser during transceiver operation, in accordance with one embodiment. A sensor 408 is placed in relation to the laser 402 in order to sense the power of the optical signal emitted by the laser during operation. As stated above, in one embodiment the laser 402 is an edge emitting laser diode. In such an embodiments the sensor 408 is a photodiode that is configured to sense a portion of the light emitted by the edge-emitting laser 402.

In further detail, upon sensing the light a resultant current is produced by the photodiode sensor 408, which current can then be extrapolated to yield a measurement of the laser power of the laser 402. The current produced by the photodiode sensor 408 is an analog signal that can be forwarded to the control module 200 via a corresponding signal line 414, as shown in FIG. 4.

In other embodiments, the laser 402 and sensor 408 can include other device combinations in addition to that explicitly described herein. Thus, the sensor 408, in addition to the other sensors to be described herein, can be selected so as to suitably operate in connection with the component for which operating measurements are desired.

A sensor 410 is positioned in relation to the bias current signal line 404 in order to sense the quantity of bias current being supplied by the line to the laser 402 during transceiver operation. As mentioned, the sensor 410 can include one of a variety of sensor types, however in the present embodiment the sensor is implemented as a resistor placed in-line with the signal line 404. Thus, measurement of the voltage drop across the resistor provides an analog result that can be extrapolated to determine the amount of bias current in the signal line 404. As with the sensor 408, this analog information can be forwarded to the control module 200 via the corresponding signal line 414.

A sensor 412 is placed in relation to the differential signal lines 406 in order to detect the amount of modulation current that is supplied to the laser 402 during transceiver operation. In the present embodiment, the sensor 412 is implemented as a resistor placed in operable communication with the amplification stage 407, which in turn is in operable communication with the differential signal lines 406. The voltage drop across the resistor can be extrapolated to determine the amount of modulation current carried in the signal lines 406. As with the sensors 408 and 410, this analog data can then be forwarded to the control module 200 via the corresponding signal line 414. Note that, collectively, the signal lines 414 shown in FIG. 4 in one embodiment correspond graphically to the signal line 105B disposed between the PA/LD 102 and the control module 105 in FIG. 2, which control module is identically represented at 200 in FIG. 3. In addition, one or more of the sensors 211A-C of the analog portion 100A of the control module 200 can alternatively be used in the place of the above-mentioned sensors.

In the illustrated embodiment, the analog data sensed by the sensor 412 can be forwarded to the control module 200 via an input/output multiplexer 416. In addition, data sensed by the sensors 408 and 410 can also be routed via the multiplexer 416, if desired.

As has been explained, each of the analog signals sensed by the sensors 408, 410, and 412 are forwarded via corresponding signal lines 414 to a controller, such as the control module that is configured to perform its functionality as described below in FIG. 3, or other suitable component. The control module 200 is employed, as will be seen below, in implementing various stages of a method for compensating for the laser slope efficiency of the laser 402.

Figure 5A:
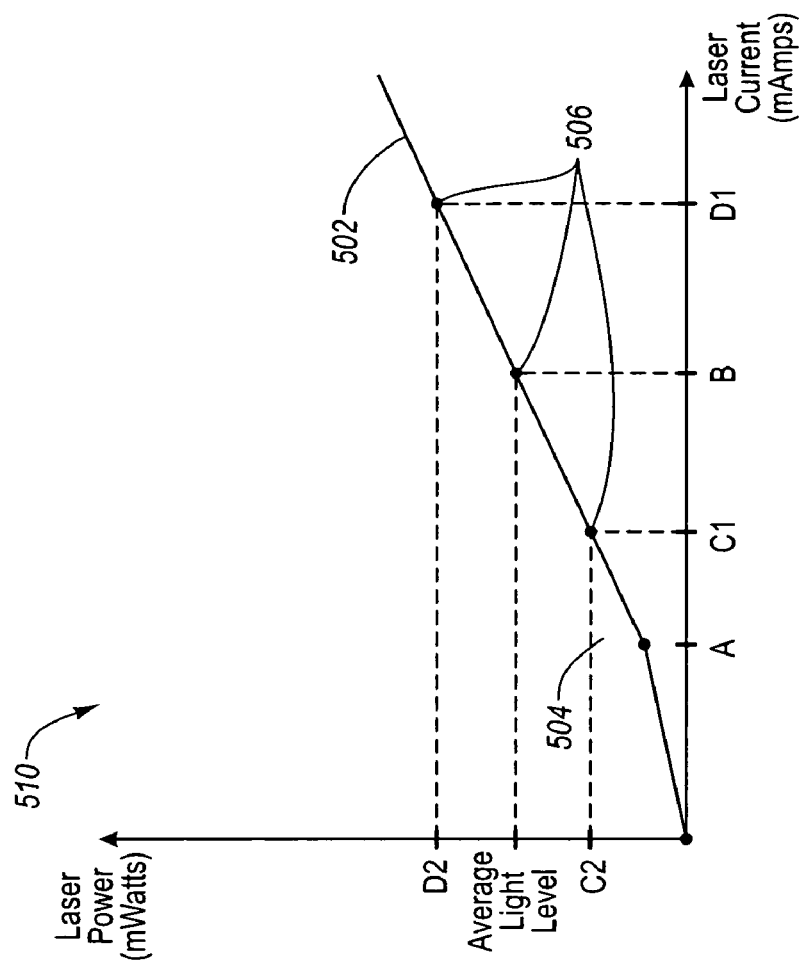
FIG. 5A is a graph showing various details of a slope efficiency curve of a laser.

Reference is now made to FIG. 5A in describing various details regarding the slope efficiency of a laser device within an optical transmitter, such as the laser 402 positioned in the TOSA 20 of FIG. 4. Generally, laser slope efficiency ("LSE") represents a ratio of the optical power output, or laser power, of a laser versus the amount of electrical current, or laser current, provided to the laser during operation. On a more basic level, LSE is a measure of the number of photons produced by the laser for a given amount of current supplied to the laser during operation. LSE can be affected by various factors during laser operation including laser temperature and the operational age of the laser.

The relationship between laser power and laser current is represented in FIG. 5A by a graph, generally designated at 500. In detail, graph 500 includes a curve 502 that depicts a relationship between the laser power, indicated on the vertical axis of the graph, and laser current of a laser indicated on the horizontal axis. The curve 502 includes a point 504, which represents a threshold point for efficient laser operation. The threshold point 504 corresponds to a specified amount of laser current, indicated on the horizontal axis of graph 500 at point A. A laser current that is below the amount shown at A provides a minimal amount of emitted laser light, or laser power on the vertical graph axis, as is shown by the relatively small slope of the curve 502 at values less than that indicated at A. Laser current in amounts greater than that indicated at A produces a relatively greater amount of lazing action by the laser, thereby corresponding to increased laser power, as represented by the relatively greater slope of the graph 502 at values greater than that indicated at A.

A predetermined amount of laser current indicated at B on the horizontal axis of the graph 500 produces an acceptable average amount of laser power in the emitted optical signal of the laser, which is indicated on the vertical axis of the graph 500 by the term "average light level" or "ALL." This average light level is produced by the DC bias current that is supplied to the laser 402 by the signal line 404 (FIG. 4). The modulation current provided by the amplification stage 407 through the differential signal lines 406B of FIG. 4 to the laser 402 is configured to modify the bias current slightly to provide relatively more or less laser current to the laser, thereby increasing or decreasing the laser power above and below the average light level. Modulation of the laser power, and hence its optical output, above and below the average light level in this manner produces respectively a high light level logic "1" and low light level logic "0" in optical format, thereby enabling the laser to optically produce the stream of digital data provided by the differential signal lines 406B.

As multiple data points are needed to define the curve 502, the amount of laser current provided to the laser can be varied in order to determine corresponding changes to the laser power. This is illustrated in FIG. 5A, wherein the laser current can be decreased from B to a relatively lower current indicated at C1, on the horizontal axis of graph 500 which produces a corresponding drop in average laser power, indicated at C2 on the vertical axis. Likewise, the laser current can be increased from B to a relatively greater current indicated at D1 on the horizontal axis, which produces a corresponding increase in average laser power, indicated at D2 on the vertical axis. This manipulation of the laser from its original current level indicated at B creates multiple graph data points 506 that, together with the data point representative of the average light level, are used to define the curve 502 and its corresponding slope, as shown in FIG. 5A. The curve 502 can therefore be defined as an indication of the ratio of laser current to laser power, i.e., laser slope efficiency for the laser, or "LSE."

Figure 5B:
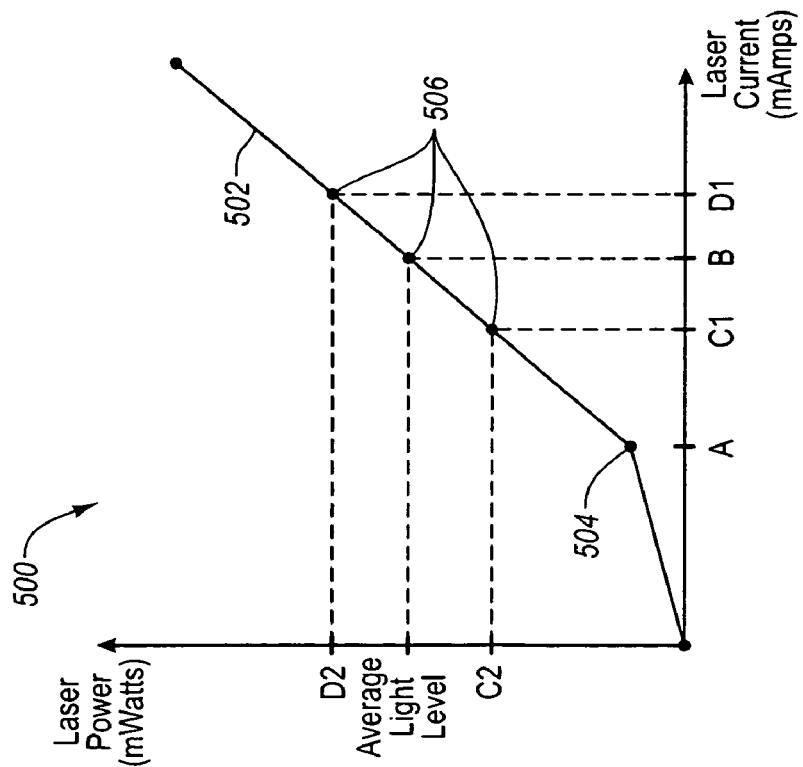
FIG. 5B is another graph showing various details of another slope efficiency of a laser.

Note that the curve 502 in FIG. 5A is relatively steep, indicating a relatively high LSE for an exemplary laser. Thus, only an incrementally small change of laser current from the average current level indicated at B is needed in order to increase or decrease the laser power with respect to the average light level an acceptable amount to enable laser emission of low and high light levels corresponding to the logic "0" and "1" optical signals. In contrast, a graph 510 of FIG. 5B shows the curve 502 representing a laser having a relatively lower LSE, wherein an incrementally greater change in laser current from the average current level indicated at B is necessary in order to acceptably modify the laser to emit at low or high light levels. It follows that the amount of modulation current that needs to be provided by the amplification stage 407 of FIG. 4 to produce the same logic "0" and "1" levels by a laser with a LSE as in FIG. 5A would be less than a laser with a LSE resembling that in FIG. 5B.

Determination of LSE for a particular laser is critical in transceiver laser operations because the average light level and various other parameters are affected thereby. For or Z instance, as has been mentioned LSE can be affected by laser temperature fluctuations, as well as by time-based changes that occur over the operational lifetime of the laser. Other parameters that are critical to proper operation of a laser and that are affected by LSE include extinction ratio ("ER"), which is a ratio of 1) the difference between a "dark level" of the laser, i.e., a point at which no light is produced by the laser, and the low light (logic "0") level; and 2) the difference between the dark level and the high light (logic "1") level. This relationship is depicted in the following equation:

$$ER = \frac{P_{Logic1}}{P_{Logic0}}. \tag{1}$$

Optical modulation amplitude ("OMA"), which is a measure of the difference between the high light level and the low light level, is directly related to extinction ratio, and as such is another parameter affected by LSE. This relationship is depicted in the following equation:

$$OMA = P_{Logic1} - P_{Logic0} \tag{2}$$

Evaluation and compensation for the LSE of the laser during optical transmission operations is therefore beneficial in maximizing laser performance and in maintaining laser operation within acceptable parameter ranges.

Figure 6:
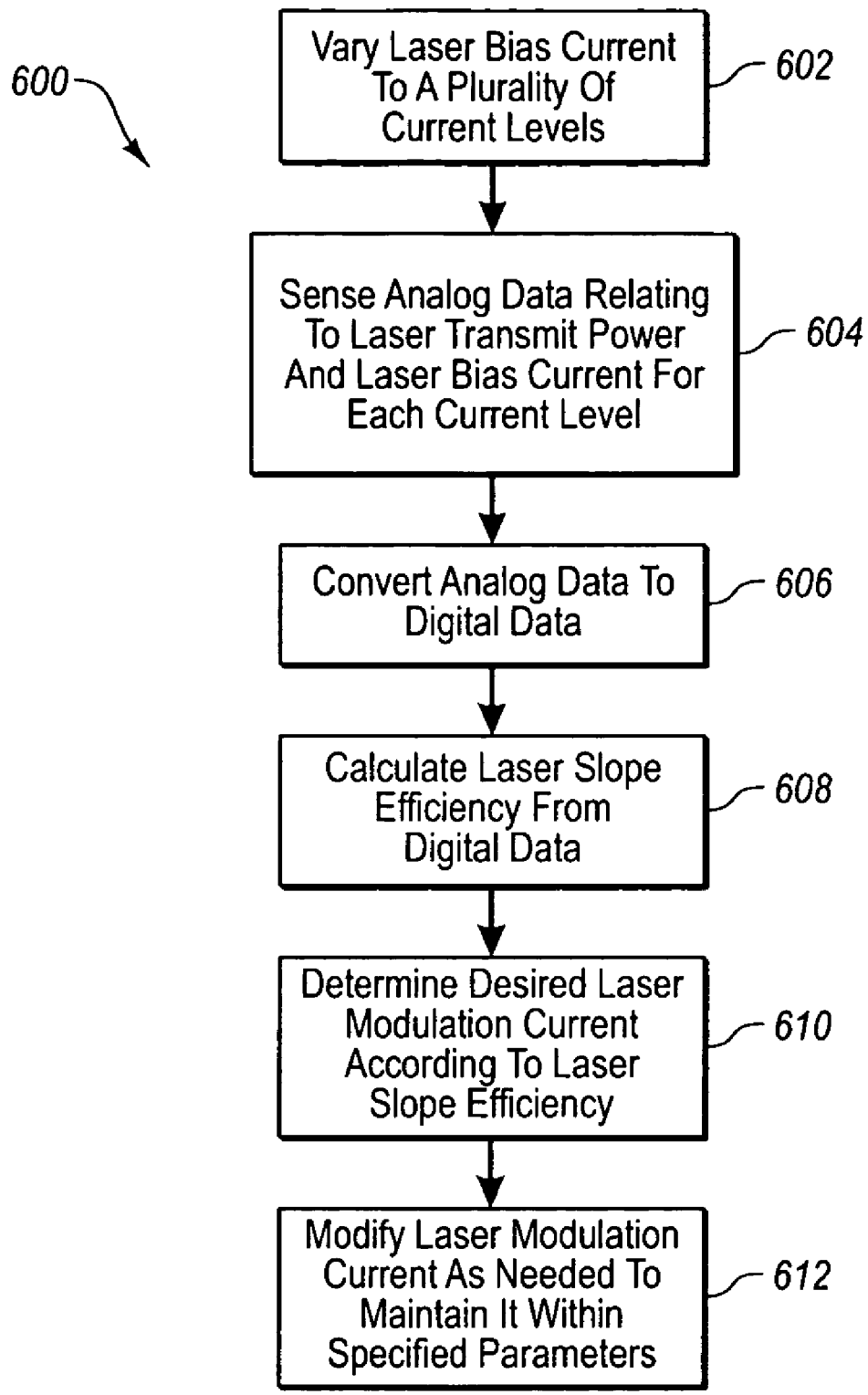
FIG. 6 is a block diagram showing various stages of a method for compensating for the slope laser efficiency of a light source, according to one embodiment of the present invention.

With continuing reference to FIGS. 2-5B, reference is now made to FIG. 6. As stated above, LSE varies during transceiver operation as a function of temperature, operational lifetime, and other factors. As such, it is desired to enable the dynamic adjustment of laser properties in response to changes in LSE in order to preserve laser operating parameters, such as average light level, extinction ratio and OMA within acceptable ranges. This in turn enhances laser performance during its operation as a component of the transceiver 100 shown in FIG. 2, or other suitable device. Accordingly, embodiments of the present invention allow for such dynamic LSE monitoring and laser adjustment in response to LSE changes during transceiver operation.

In accordance with one embodiment, therefore, a method is followed to enable dynamic determination of and compensation for LSE of a laser, such as the laser 402 of the transceiver 100, during transceiver operation. This method is generally depicted at 600 in FIG. 6. In a first stage 602, the laser current provided to the laser 402 of the TOSA 20 (FIG. 4), is varied to a plurality of current levels. Stage 602 is visually depicted in FIG. 5A, wherein the laser bias current provided to the laser 402 via signal line 404 (FIG. 4) is varied both above and below the average current level B to levels C1 and D1, as has been described. In the present embodiment, variance of the bias current is governed via instructions provided to the laser driver portion 102B of the PA/LD 102 by the control module 200 (FIG. 3) via a suitable connection between the control module and the PA/LD, such as the signal lines indicated at 105A and 105B in FIG. 3. In the present embodiment, the PA/LD 102 governs variance of the laser bias current, but in an alternative embodiment other components can be configured to perform similar, suitable functionality. Also, though shown in FIG. 5A as including two bias current variances from the average light level, stage 602 can include more than two bias current levels, if desired, in order to provide additional data for the method 600.

Variance of the laser bias current in stage 602 can occur during transceiver operation, or when the transceiver is not being employed for optical signal transmission so as not to interfere with such transmission.

In stage 604, laser bias current and laser transmit power data relating to the variance of the laser bias current in stage 602 are sensed. In one embodiment, the data sensed in this stage are analog data, and are gathered by one or more of the sensors described above in connection with FIG. 4. Specifically, analog data relating to the amount of laser bias current that is varied in stage 602 can be obtained by the sensor 410 positioned in the PA/LD 102. Similarly, the amount of corresponding variance in laser transmit power as a result of the bias current variance can be sensed by sensor 408 in the TOSA 20, which in one embodiment is a photodiode, as has been explained. The analog data relating to the sensing of each of the sensors 408 and 410 is forwarded to the control module 200 via the signal lines 414, as has been described.

In stage 606, the analog data is converted to digital data. As mentioned, in one embodiment the control module 200 shown in FIG. 3 accesses the analog data. Such accessing of the analog data can be performed by transmission of the data from the various sensors 408 and 410 via the signal lines 414 to the control module via signal lines 212A, 212B, or other suitable signal lines. The data received by signal lines 212A and 212B can then be forwarded to the analog-to-digital ("ADC") converter 214 shown in the analog portion 200A of the control module 200 for conversion into digital data. In another embodiment, however, the analog data sensed by the sensors 408, 410, and 412 can be converted from analog to digital data via an analog-to-digital converter (not shown) located in the PA/LD 102 itself. In yet another embodiment, the analog-to-digital converter can be positioned exterior to both the PA/LD 102 and the control module 200. In such an instance, the signal lines 414 can be forwarded and connected to the converter for conversion of the analog data to digital data before being forwarded to the digital portion 200B of the control module 200 via the external device interface 205, for instance. Thus, the illustrated configuration as shown in FIGS. 3 and 4 is not to be considered restrictive of the present invention in any way.

In stage 608, the laser slope efficiency is calculated from the digital data received by the control module 200. In the present embodiment the data, once digitally converted by the ADC 214, are forwarded by the digital portion 200B of the control module 200. Specifically, the data are accessed by one of the processors 203A, 203B, or alternatively, by the controller system memory 206, or other suitable location. One or both of the processors 203A, 203B are then employed to analyze the digital data accessed from the sensors 408 and 410 of the TOSA 20 and PA/LD 102, respectively, in order to determine the relationship between laser current input for the laser 402 and its resultant laser transmit power, which relationship is exemplarily shown in FIGS. 5A and 5B. This relationship is depicted in the following equation with reference to graph points shown in FIGS. 5A and 5B:

$$LSE = \frac{D2 - C2}{D1 - C1}. \tag{3}$$

Once this relationship is determined the laser slope efficiency is known, and such results can be used immediately, as will be shown, or stored until an appropriate time in the controller system memory 206 or other suitable location, either within or outside of the control module 200. Thus, as a result of execution of stage 608, slope laser efficiency is determined.

It is noted that, in connection with stage 608, various data can be stored for future use. For instance laser slope efficiency data, once determined, can be stored until needed, as mentioned above. Such storage can take place in a volatile memory location, such as the controller system memory 206, or in a non-volatile location, such as the persistent memory 106 in the PCB 50 (FIG. 2). The raw data used in stage 608 to determine the laser slope efficiency can also be stored in a similar manner, until such time as determination of the laser slope efficiency is needed.

The storage of laser slope efficiency data can be useful for several reasons, among them, benchmarking purposes for future calculations, determining prior settings when the transceiver is powered on after a period of shut-off, or for estimation purposes when time does not allow for a full laser slope efficiency calculation to be made. In addition, stored past efficiency data can be accessed when examining a failed module from the field as part of failure analysis procedures.

It is further appreciated that stored or real-time laser slope efficiency can be forwarded to the host 111 via the SDA line or other suitable means to enable the host to execute any measures it deems necessary based on the provided data.

It is noted that the control module 200 includes the necessary firmware and microcode in order to process the data and to issue commands to the PA/LD 102 as needed for proper operation of the laser 402 of the TOSA 20, as is described herein.

In stage 610, a desired laser modulation current is determined according to the laser slope efficiency determination found in stage 608. With the laser slope efficiency now known, the present stage can determine what quantity of laser modulation current should be provided the laser 402 via the differential signal lines 406 in order to maintain the laser at the desired extinction ratio ("ER") or optical modulation amplitude ("OMA"). correspondingly increase or decrease the laser power with respect to the average light level in order to optically produce high and low light levels corresponding to logical "1" and logical "0" bits, respectively. For instance, should stage 608 calculate a laser slope efficiency similar to that shown in FIG. 5A, stage 610 will determine that a relatively smaller modulation current need be provided to the laser 402 in order to produce a sufficiently high and low light levels. In contrast, should the determined laser slope efficiency resemble that of the curve 502 of FIG. 5B, a relatively greater modulation current difference will need to be provided to the laser 402 in order to effectuate similar high and low light levels.

The determination of the desired laser modulation current of stage 610 is performed in one embodiment by one or both of the processors 203A and 203B, in connection with one or more of the components shown in the digital portion 200B of the controller 200, or other suitable componentry not explicitly shown.

If the desire is to maintain a particular extinction ratio ("ER"), the controller 200 first calculates at least one of the necessary Logic "1" and Logic "0" optical power levels, i.e., high and low light levels, denoted respectively as $P_{Logic1}$ and $P_{Logic0}$. The following equations, by way of example, can be evaluated to determine those optical powers:

$$P_{Logic1} = 2 * P_{average} \left[ \frac{ER}{ER+1} \right], \quad (4)$$

$$P_{Logic0} = 2 * P_{average} \left[ \frac{1}{ER+1} \right]. \quad (5)$$

To complete the calculations of Logic "1" and Logic "0" optical power levels, the controller 200 sets $P_{average}$ equal to the Average Light Level as in FIG. 5A or 5B, and sets ER equal to the desired extinction ratio. The nature of equations (4) and (5) is such that the absolute value of the difference between $P_{Logic1}$ and $P_{average}$ is equal to the absolute value of the difference between $P_{Logic0}$ and $P_{average}$. Thus it may not be necessary for the controller 200 to actually calculate both logic power levels.

If the desire is to maintain a particular optical modulation amplitude ("OMA"), the controller 200 first calculates at least one of the necessary Logic "1" and Logic "0" optical power levels, denoted respectively as $P_{Logic1}$ and $P_{Logic0}$. The following equations, by way of example, can be evaluated to determine those optical powers:

$$P_{Logic1} = P_{average} + \frac{OMA}{2}, \quad (6)$$

$$P_{Logic0} = P_{average} - \frac{OMA}{2}. \quad (7)$$

To complete the calculations of Logic "1" and Logic "0" optical power levels, the controller 200 sets $P_{average}$ equal to the Average Light Level as in FIG. 5A or 5B, and sets OMA equal to the desired optical modulation amplitude. The nature of equations (6) and (7) is such that the absolute value of the difference between $P_{Logic1}$ and $P_{average}$ is equal to the absolute value of the difference between $P_{Logic0}$ and $P_{average}$. Thus it may not be necessary for the controller 200 to actually calculate both logic power levels.

Regardless of whether it is trying to maintain ER or OMA, after calculating the Logic "1" and Logic "0" optical powers desired, the controller 200 next calculates the amount of modulation current that will be required to obtain the Logic "1" and "0" powers. In one embodiment, either of the following equations can be evaluated to determine the necessary modulation current ("MC"):

$$MC = \frac{P_{Logic1} - P_{average}}{LSE}, \quad (8)$$

$$MC = \frac{P_{average} - P_{Logic0}}{LSE}. \quad (9)$$

It should be noted that only one of $P_{Logic1}$ or $P_{Logic0}$ values is actually needed to make the final calculation of modulation current. However, it may be advantageous to calculate modulation current using both equations (8) and (9) and then combine the two results, for example as an average of the two answers, to help reduce error in the calculation due to measurement error. It is recognized that in the physical implementation of stage 610 described in detail here that other laser characteristics, such as AC response and heating effects due to modulation current, may require additional calibrations in the system or other constant or variable terms to be added to the above equations for calculating modulation current.

In a final stage 612, the laser modulation current provided to the laser 402 is modified as needed to maintain it within specified parameters. As mentioned above, the laser modulation current is provided by the differential signal lines 406 to the laser 402. The sensor 412 is placed in relation to the differential signal lines 406 to enable the laser modulation current to be ascertained by the control module 200 during laser operation. As was the case with the sensors 408 and 410, the laser modulation current data provided by the sensor 412 is analog in nature and therefore must be converted in the manner described above to digital data before use by the digital portion 200B of the control module 200. Once digitized, the laser modulation current data can be examined by one or both of the processors 203A and 203B to determine whether it matches the desired laser modulation current determined in stage 610 above. If a discrepancy exists between the actual laser modulation current and the desired modulation current, instructions can be sent by the control module 200 to the PA/LD 102 to modify the laser modulation current as needed. Such instructions from the control module 200 can be sent by the external device interface 205 to the PA/LD 102. In another embodiment, the digital instructions for modifying the laser modulation current can be converted to analog instructions by the analog portion 200A before transmission to the PA/LD 102. In yet another embodiment, an analog-to-digital converter can be placed in the PA/LD 102 or other location to convert the digital control module instructions into analog instructions before use by the PA/LD. In any event, once the instructions are received, the PA/LD 102 modifies the laser modulation current to match the desired current level.

Optionally, the sensor 412 can be employed in a feedback mode to ensure proper modulation current is achieved. In this way, laser operation is optimized according to the current laser slope efficiency of the laser 402 during transceiver operation. Such a feedback mode can be achieved via an analog feedback loop included in the PA/LD 102 or in a feedback loop established between the sensor and the control module 200. In the latter case, this enables the control module to make periodic adjustments to the laser modulation current by sensing current modulation current and comparing it to the desired current setting.

The method 600 shown in FIG. 6 is continuously or periodically repeated so as to compensate for any changes in laser slope efficiency during the operation of the transceiver 100. Such changes in laser slope efficiency, as discussed before, can be caused by laser temperature fluctuations, or as the result of laser aging. Thus, the method 600, being a dynamic method, provides a manner by which laser slope efficiency can be dynamically determined and compensated for during transceiver operation.

In an alternative embodiment, the above equations can be utilized to determine the ER and OMA currently being produced by a laser, in a reversal to the above process. Information regarding ER and OMA determination could then be provided to the Host, or stored in non-volatile memory for other purposes.

Again, and as mentioned above, should communication with the external host 111 be desired in order to alert it to the LSE, modulation current, extinction ratio or optical modulation amplitude status, this communication can occur in one embodiment via the host communication interface 204 of the control module digital portion 200B, which utilizes the SDA and SCL signal lines shown in FIG. 2 in communicating with the host.

In addition, compensation for LSE as described herein enables estimation of remaining lifetime of the laser, thereby allowing changeout of the transceiver at a prudent time before failure of the laser occurs. Further details relating to this are found in U.S. Provisional Patent Application No. 60/641,117, entitled "OPTICAL TRANSCEIVER MODULE END OF LIFE INDICATION," filed Jan. 3, 2005, which is incorporated herein by reference in its entirety.

Maintenance of the laser modulation current within acceptable parameter ranges according to the method 600 described above further enables the laser to operate within acceptable parameter ranges in terms of the extinction ratio and/or the OMA of the laser. This further serves to optimize laser operation and effective data transfer by the transceiver 100.

Additionally, practice of embodiments of the present invention enables the life expectancy of certain transceivers to be extended over what would otherwise be possible. This is so because embodiments of the present invention enable dynamic adjustments to the modulation current be made so as to bring transceivers that are otherwise exceeding allowable parameters back into acceptable ranges. One particularly useful application of the above is in older transceivers, as it is well known that such transceivers tend to fall out of compliance in terms of allowable parameter ranges (e.g., extinction ration, OMA) as they age. Thus by configuring transceivers with the dynamic ability to compensate for such age-related changes, the transceiver can be left in use a relatively longer period of time when compared with a transceiver having no such functionality.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical transmitter device, comprising:
   a transmitter optical subassembly including a laser;
   a plurality of sensors that sense data regarding bias current, modulation current, and transmit power of the laser; and
   a processor containing microcode that, when executed, causes the processor to execute the following:
      determine a slope efficiency of the laser using at least some of the data acquired by the plurality of sensors, wherein execution by the processor to determine the slope efficiency further comprises execution of the following:
         compare a ratio of bias current to transmit power data for a plurality of bias current levels of the laser; and
      adjust the modulation current of the laser according to the determined slope efficiency.

2. The optical transmitter device as defined in claim 1, wherein the plurality of sensors are positioned in a laser driver operably connected to the transmitter optical subassembly.

3. The optical transmitter device as defined in claim 2, wherein the sensor that senses modulation current is included in a feedback loop with at least one of the laser driver and the processor to enable periodic adjustment of the modulation current.

4. The optical transmitter device as defined in claim 1, further comprising a sensor that senses data relating to a modulation current of the laser.

5. The optical transmitter device as defined in claim 4, wherein the data regarding the bias current, transmit power, and modulation current are analog data.

6. The optical transmitter device as defined in claim 5, further comprising at least one analog-to-digital converter for converting the analog data relating to the bias current, transmit power, and modulation current.

7. The optical transmitter device as defined in claim 6, wherein the analog-to-digital converter and processor are included in a control module.

8. The optical transmitter device as defined in claim 1, wherein the processor further executes the following:
   determine a desired modulation current of the laser according to the determined slope efficiency.

9. The optical transmitter device as defined in claim 1, wherein the transmitter optical subassembly is positioned in an optical transceiver module.

10. A method for setting a modulation current for a laser of an optical transmitter, the method comprising:
   sensing data relating to laser transmit power and laser bias current at a plurality of laser bias current levels;
   by a processor, calculating a slope efficiency of the laser using the data by comparing a ratio of bias current to transmit power data for a plurality of bias current levels of the laser;
   by the processor, determining a desired modulation current for the laser using the slope efficiency; and
   if needed, modifying the modulation current of the laser to match the desired modulation current.

11. The method for setting as defined in claim 10, wherein sensing data further comprises:
   acquiring data relating to the laser transmit power at both a laser bias current level that is greater than an average light level bias current and a laser bias current level that is less than the average light level bias current.

12. The method for setting as defined in claim 10, wherein sensing data further comprises:
   sensing the laser transmit power by a photodiode positioned in relation to the laser; and
   sensing the laser bias current by a resistor placed in series with a laser bias current signal line.

13. The method for setting as defined in claim 10, further comprising:
   at least temporarily storing the data in a memory that is accessible by the processor.

14. The method for setting as defined in claim 10, wherein the method is periodically repeated to compensate both for changes in laser temperature and changes that occur in the laser over its operational lifetime.

15. The method for setting as defined in claim 10, wherein the processor is included as a component of a digital control module.

16. The method for setting as defined in claim 10, wherein determining the desired modulation current further comprises:
   calculating the laser transmit power corresponding to at least one of a logic "1" and a logic "0" power level.

17. A method for compensating for a slope efficiency of a laser, the laser forming part of an optical transmitter, the method comprising:
   (a) varying a bias current of the laser to at least two bias current levels;
   (b) sensing analog data relating to transmit power and bias current of the laser for the at least two bias current levels;
   (b) converting the analog data to digital data;
   (c) calculating a slope efficiency of the laser using the digital data by comparing a ratio of bias current to transmit power data for a plurality of bias current levels of the laser;
   (d) determining a desired modulation current for the laser according to the slope efficiency;
   (e) if needed, setting the modulation current for the laser according to the desired modulation current; and
   (f) periodically repeating acts (a) through (e).

18. The method for compensating as defined in claim 17, wherein at least one of the at least two bias current levels is below an average light level bias current, and wherein at least one of the at least two bias current levels is above the average light level bias current.

19. The method for compensating as defined in claim 18, wherein setting the modulation current further comprises:
   setting the modulation current for the laser according to the desired modulation current such that at least one of an extinction ratio and an optical modulation amplitude of the laser is maintained within acceptable parameter ranges.

20. The method for compensating as defined in claim 19, wherein varying the bias current further comprises:
   varying the bias current from a current level sufficient to sustain an average light level.

21. The method for compensating as defined in claim 20, further comprising:
   at least temporarily storing data relating to the slope efficiency in the optical transmitter.

22. The method for compensating as defined in claim 21, further comprising:
   reporting at least some of the stored data to a host system in operable communication with the optical transmitter.

* * * * *

UNITED STATES PATENT AND TRADEMARK OFFICE
CERTIFICATE OF CORRECTION

PATENT NO. : 7,639,952 B2  Page 1 of 1
APPLICATION NO. : 11/386374
DATED : December 29, 2009
INVENTOR(S) : Stephen T. Nelson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 911 days.

Signed and Sealed this

Ninth Day of November, 2010

David J. Kappos
*Director of the United States Patent and Trademark Office*